United States Patent [19]

Andersen

[11] Patent Number: 4,857,825

[45] Date of Patent: Aug. 15, 1989

[54] VOLTAGE CONTROLLED RESISTOR

[75] Inventor: Robert D. Andersen, West Covina, Calif.

[73] Assignee: Datatape, Inc., Pasadena, Calif.

[21] Appl. No.: 245,473

[22] Filed: Sep. 16, 1988

[51] Int. Cl.$^4$ ............................................. G05B 24/02
[52] U.S. Cl. ................................... 323/353; 323/902; 250/205
[58] Field of Search ............... 323/353, 354, 902, 907, 323/289; 330/260, 291, 292, 294; 250/205

[56] References Cited

U.S. PATENT DOCUMENTS

| | | | |
|---|---|---|---|
| 3,325,724 | 6/1967 | Aiken | 323/221 |
| 3,423,579 | 1/1969 | Del Duca | 235/845 |
| 3,525,860 | 8/1970 | Barber | 364/845 |
| 3,542,479 | 11/1970 | Sibalis | 356/443 |
| 3,745,477 | 7/1973 | Freeborn | 330/260 X |
| 3,967,904 | 7/1976 | Cade | 356/432 |
| 4,056,719 | 11/1977 | Waaben | 250/205 X |
| 4,104,526 | 8/1978 | Albert | 378/106 |
| 4,138,635 | 2/1979 | Quinn | 323/902 X |
| 4,140,962 | 2/1979 | Quinn | 323/902 X |
| 4,375,051 | 2/1983 | Theall | 328/69 X |
| 4,417,179 | 11/1983 | Fujimura et al. | 250/205 X |
| 4,551,636 | 11/1985 | Andrews et al. | 307/264 |
| 4,588,883 | 5/1986 | Abbas | 250/205 |
| 4,605,848 | 8/1986 | Ogawa | 250/205 |
| 4,629,880 | 12/1986 | Zimmermann | 250/205 |
| 4,739,948 | 4/1988 | Rodal et al. | 242/190 |

FOREIGN PATENT DOCUMENTS 7803676  10/1978  Netherlands ...................... 330/260

OTHER PUBLICATIONS

Sokoloski et al., "An Automatic Voltage Control Circuit", Rev. Sci. Instrum., 2/74, p. 295.

Primary Examiner—Peter S. Wong
Assistant Examiner—Kristine Peckman
Attorney, Agent, or Firm—William F. Noval

[57] ABSTRACT

A resistor has a resistance which is precisely controlled by means of a voltage control circuit. The controlled resistor is a radiation sensitive device which is optically coupled to a source of radiation connected to the output of an operational amplifier. A control circuit applies a controllable (preferably programmable) voltage, functionally related to a desired resistance of the controlled resistor, to the input of the operational amplifier. Also connected to the input of the operational amplifier is a feedback radiation sensitive resistor, which is also optically coupled to the radiation source. Preferably, the controlled radiation sensitive resistor and the feedback radiation sensitive resistor have substantially identical resistance characteristics. A compensation circuit is electrically connected between the input and output of the operational amplifier. The compensation circuit substantially eliminates cyclical variations in the resistance of the controlled resistor caused by a response lag between the radiation source control and the radiation sensitive resistors.

13 Claims, 3 Drawing Sheets

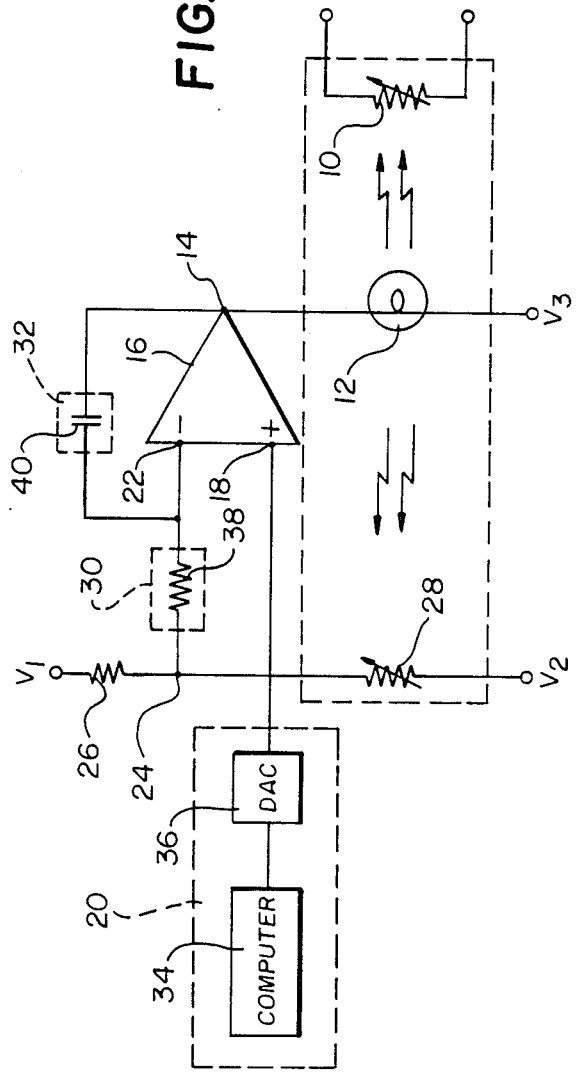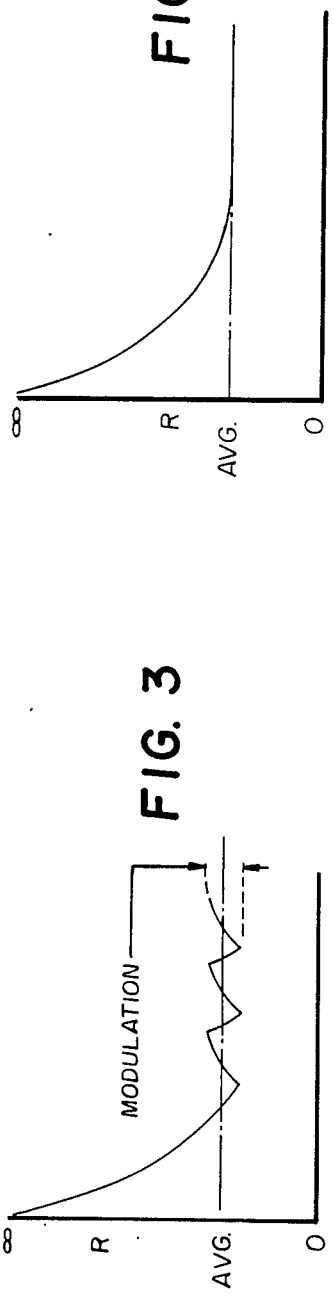

VOLTAGE CONTROLLED RESISTOR

BACKGROUND OF THE INVENTION

This invention relates in general to a resistor, the resistance of which may be precisely controlled, and more particularly, to a radiation sensitive resistor whose resistance is precisely controlled at a constant value by means of a digitally programmable voltage source.

Many electrical circuits have parameters which must be calibrated by varying the value of electrical components in the circuit. Thus, in a multi-channel magnetic tape recorder, it is often desirable to calibrate the resistance of each signal processing channel in order to effect equalization between the signals in the multiple channels. Calibration of the resistors in each of the several recorder channels may be effected by manually varying the resistance of each resistor by means of a tool such as a screwdriver. Manual calibration is disadvantageous because it is slow, difficult to effect in inaccessible locations, labor intensive, and expensive. Moreover, if the circuit component to be calibrated is remotely located, calibration may be virtually impossible. Thus, there is a need for a resistor which may be calibrated easily, quickly, and inexpensively, even when the resistor is part of a circuit which is in a remote or inaccessible location. With the widespread digital control of electronic equipment, it is also desirable that calibration of the resistors in an electronic circuit be compatible with digital techniques.

SUMMARY OF THE INVENTION

According to the present invention, there is provided a solution to the problems enumerated above. According to an aspect of the invention, there is provided a resistor, the resistance of which may be precisely controlled in a simple, efficient, and precise manner by means of a predetermined voltage control signal. The voltage control signal may be effected by means of a digital control circuit so that the controlled resistor may be located in a remote or inaccessible location. According to another aspect of the invention, the voltage controlled resistor comprises a radiation sensitive resistor which is optically coupled to a radiation source. The radiation source is electrically connected to the output of an operational amplifier whose input is connected to a digitally programmable control voltage. A feedback radiation sensitive resistor (which is optically coupled to the radiation source), is connected to the input of the operational amplifier. The controlled radiation sensitive resistor and the feedback radiation sensitive resistor have substantially identical resistance characteristics.

According to another feature of the present invention, a compensation circuit is electrically connected between the input and output of the operational amplifier. This compensation circuit stabilizes the resistance of the controlled radiation sensitive resistor at a precise constant value.

BRIEF DESCRIPTION OF THE DRAWINGS

In the detailed description of the preferred embodiment of the invention presented below, reference is made to the accompanying drawings in which like elements are provided with like numbers.

FIG. 2 is an electrical schematic diagram of a more specific embodiment of the present invention;

FIG. 3 is a graph of resistance versus time, which illustrates operation of the embodiment of FIG. 2 without a compensation circuit;

FIG. 4 is a graph of resistance versus time, which illustrates operation of the compensated embodiment of FIG. 2.

DESCRIPTION OF THE PREFERRED EMBODIMENT

Figure 1:
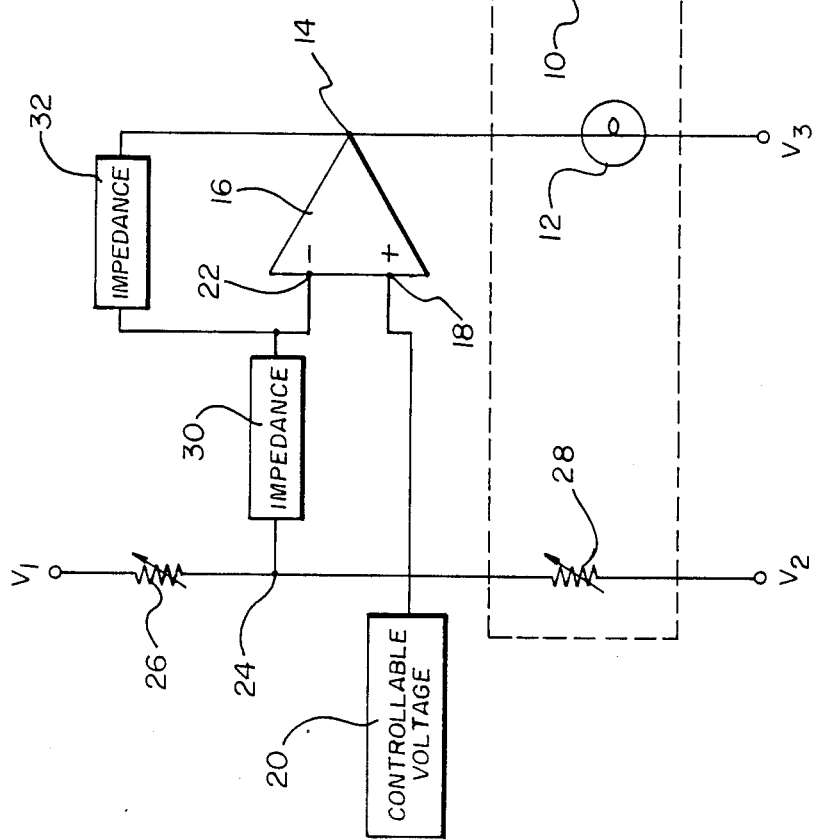
FIG. 1 is an electrical schematic diagram of a preferred embodiment of the present invention.

Referring now to FIG. 1, there is shown a preferred embodiment of the present invention. As shown, a controlled radiation sensitive resistor 10 is optically coupled to a radiation source 12 (such as a lamp or LED) which is connected between a fixed voltage $V_3$ and the output terminal 14 of operational amplifier 16. The non-inverting input 18 of operational amplifier 16 is connected to a controllable voltage source 10. The inverting input 22 of amplifier 16 is electrically connected to the input junction 24 between reference resistor 26 and feedback radiation sensitive resistor 28, which is also optically coupled to radiation source 12. Resistors 26 and 28 are electrically connected in series between reference voltages $V_1$ and $V_2$. Radiation sensitive resistors 10 and 28 have substantially identical radiation sensitive resistance characteristics. A current source may be used in lieu of reference resistor 26.

The operation of the circuit of FIG. 1 is as follows. In order to calibrate the resistance of resistor 10 at a preselected value, controllable voltage source 20 applies a preselected voltage to input terminal 18 of operational amplifier 16. In general, the resistance of resistor 10 is a function of the voltage applied by source 20. This functional relationship is effected through the optical coupling of radiation source 12 to both controlled radiation sensitive resistor 10 and feedback radiation sensitive resistor 28. Since the voltage difference between the two inputs of an operational amplifier is generally maintained at zero volts, when a predetermined voltage is applied by source 20 to input terminal 18, radiation source 12 will change its radiation output. Such change in radiation output causes feedback radiation sensitive resistor 28 to change its resistance, thus forcing the voltage applied to terminal 22 to equal the voltage applied to terminal 18 by source 20. Since resistors 28 and 10 have substantially identical radiation sensitive resistance characteristics, the resistance of both resistors will be equal. Thus, by controlling the resistance of feedback resistor 28 to a preselected value, the resistance of controlled resistor 10 will be calibrated to the same value.

Without the compensation circuit comprising impedances 30 and 32, the circuit of FIG. 1 would cause resistor 10 to have an average resistance value proportional to the control voltage signal applied by source 20 to operational amplifier 16. The actual resistance value would be cyclical about its average value (see FIG. 3). This effect is caused by the response lag between the change in the output of radiation source 12 and the change in the resistance of optically coupled feedback radiation sensitive resistor 28. Radiation source 12 is switched on and off in such proportions that the average radiation level of source 12 is that level necessary to produce the average resistance of the optically coupled radiation sensitive resistors 10 and 28. Since the actual resistance of resistor 10 varies about this average resistance, such a resistor would be unsuitable as a control element in applications where a precisely controlled constant resistance must be provided. Thus, it is necessary to stabilize the feedback network of the operational amplifier 16 in order to compensate for the lag between radiation source 12 and feedback resistor 28. According to the present invention, the compensation circuit includes an impedance 30, connected between junction 24 and input terminal 22, and an impedance 32, connected between input terminal 22 and output terminal 14 of operational amplifier 16. Impedance 30 is essentially resistive and impedance 32 is essentially capacitive. However, impedance 30 may include a capacitor in series or parallel with the resistor and impedance 32 may include a resistor in series or parallel with a capacitor.

The operation of the circuit of FIG. 1 is illustrated in FIG. 4. As shown, the resistance value of resistors 10 and 28 is stabilized at a precise constant value which does not vary about an average value. This stabilized operation is to be compared with the operation shown in FIG. 3 in which the resistance is shown as varying cyclically with respect to an average resistance. Thus the embodiment of the present invention shown in FIG. 1 provides a precisely calibrated resistor which may be used in circuits which must meet exacting tolerance specifications.

Referring now to FIG. 2, there is shown a more specific embodiment of the invention. As shown, controllable voltage source 20 includes a digital computer 34 which provide digital control signals to digital-to-analog converter (DAC) 36. DAC 36 produces a preselected control voltage which is a function of the digital control signal from computer 34. Thus, the resistance of resistor 10 may be precisely controlled by means of signals generated by computer 34, which is remotely located from resistor 10. This, for example, calibrated resistor 10 may form part of an input signal channel of a magnetic tape recorder which is remotely located from the digital control unit from which calibration signals are sent.

Impedance 30 may include a resistor 38 and impedance 32 may include a capacitor 40. The time constant of resistor 38 and capacitor 40 is adjusted to compensate for the lag produced by the optical feedback response of radiation source 12 and feedback radiation sensitive resistor 28.

Figure 5:
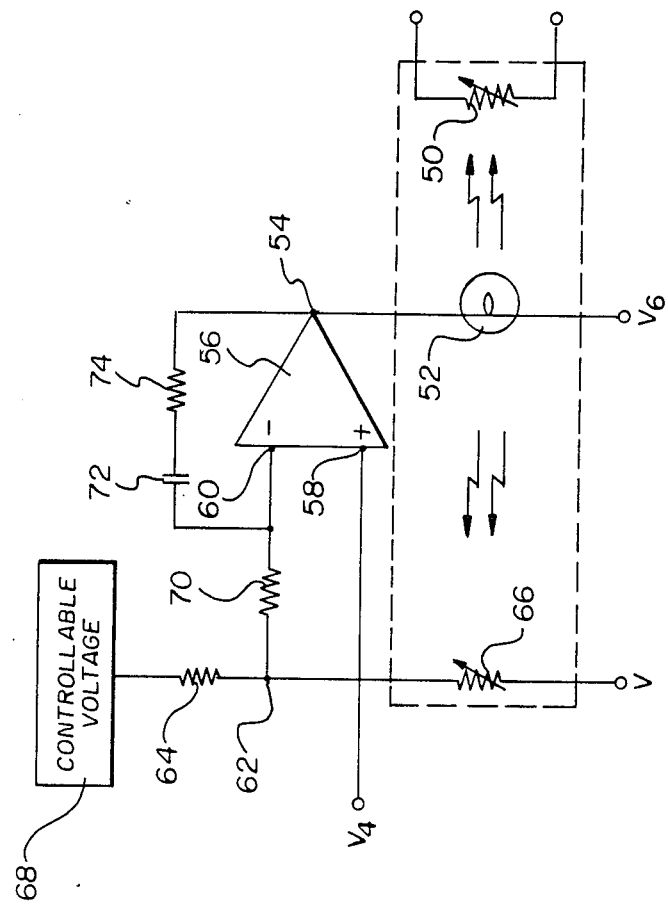
FIG. 5 is an electrical schematic diagram of another embodiment of the present invention.

Another embodiment of the present invention is shown in FIG. 5. As shown, a controlled radiation sensitive resistor 50 is optically coupled to a radiation source 52. Source 52 is electrically connected between output 54 of operational amplifier 56 and reference voltage V$_6$. The non-inverting input 58 of amplifier 56 is electrically connected to reference voltage V$_4$. The inverting input 60 of amplifier 56 is electrically connected to the junction 62 between resistor 64 and feedback radiation resistor 66, which is also optically coupled to radiation source 52. Resistors 64 and 66 are electrically connected in series between controllable voltage source 68 and reference voltage V$_5$. A compensation circuit includes resistor 70 connected between junction 62 and input 60 of amplifier 56 and capacitor 72 and resistor 74 connected between output 54 and input 60 of amplifier 56.

The operation of the embodiment shown in FIG. 5 is similar to the operation of the embodiments shown in FIGS. 1 and 2. Thus, in order to set resistor 50 at a preselected resistance value, a preselected voltage is applied by controllable voltage source 68 to cause radiation source 52 to change its radiation output. This change in radiation output is optically coupled to radiation sensitive resistors 50 and 66 to cause a change in their resistance value to the preselected resistance value.

The invention has been described in detail with particular reference to preferred embodiments thereof, but it will be understood that variations and modifications can be effected within the spirit and scope of the invention.

What is claimed is:

1. A voltage controlled resistor circuit comprising:
   an operational amplifier having an output and an input;
   a radiation source electrically connected to said output of said operational amplifier;
   a feedback radiation sensitive resistor which is optically coupled to said radiation source and which is electrically connected to the input of said operational amplifier;
   a controlled radiation sensitive resistor which is optically coupled to said radiation source, but which is electrically isolated from said radiation source;
   controllable voltage means for applying a preselected control voltage to said input of said operational amplifier to change the radiation output of said radiation source in order to produce a preselected resistance of both said feedback radiation sensitive resistor and said controlled radiation sensitive resistor, wherein said preselected resistances are a function of said preselected control voltage; and
   a compensation circuit, electrically connected between said input and output of said operational amplifier, for stabilizing the preselected resistance of said controlled radiation sensitive resistor to a precise constant value, wherein said compensation circuit has a time constant which compensates for the lag produced by the optical feedback response of said feedback radiation resistor to said radiation source.

2. The circuit of claim 1 wherein said controllable voltage means includes digitally programmable means for producing said control voltage.

3. The circuit of claim 2 wherein said digitally programmable means includes a programmable source of a digital control signal and a digital-to-analog converter for converting said digital control signal into a control voltage which is applied to the input of said operational amplifier.

4. The circuit of claim 3 wherein said programmable source includes a digital computer.

5. The circuit of claim 1 wherein said compensation circuit includes a resistor electrically connected to the input of said operational amplifier, and further includes a capacitor electrically connected between said input and said output of said operational amplifier.

6. The circuit of claim 1 wherein said feedback radiation sensitive resistor and said controlled radiation sensitive resistor have substantially identical radiation sensitive resistance characteristics.

7. A digitally programmable voltage controlled resistor circuit comprising:
   an operational amplifier having an output and an input;
   a radiation source electrically connected to said output of said operational amplifier;

a feedback radiation sensitive resistor which is optically coupled to said radiation source, and which is electrically connected to the input of said operational amplifier;

a controlled radiation sensitive resistor which is optically coupled to said radiation source, but which is electrically isolated from said radiation source, wherein said controlled radiation sensitive resistor and said feedback radiation sensitive resistor have substantially identical radiation sensitive resistance characteristics;

digitally programmable control means for applying a preselected control voltage to said input of said operational amplifier to change the radiation output of said radiation source in order to produce a preselected resistance of both said feedback radiation sensitive resistance and said controlled radiation sensitive resistor, wherein said preselected resistances are a function of said control voltage; and a compensation circuit means connected between said input and said output of said operational amplifier for stabilizing the preselected resistance of said controlled radiation sensitive resistor to a precise constant value, wherein said compensation circuit has a time constant which compensates for the lag produced by the optical feedback response of said feedback radiation sensitive resistor to said radiation source.

8. The circuit of claim 7 wherein said digitally programmable control means includes a programmable source of a digital control signal and a digital-to-analog converter for converting said digital control signal into a control voltage which is applied to the input of said operational amplifier.

9. The circuit of claim 7 wherein said input of said operational amplifier includes first and second input terminals; wherein said feedback radiation sensitive resistor is electrically connected to said first input terminal of said amplifier; and wherein said digitally programmable control means is electrically connected to said second input terminal of said amplifier.

10. The circuit of claim 7 wherein said input of said operational amplifier includes first and second input terminals; wherein said feedback radiation sensitive resistor and said digitally programmable control means are electrically connected to said first input terminal of said amplifier; and wherein a reference voltage source is electrically connected to said second input terminal of said amplifier.

11. The circuit of claim 7 wherein said compensation circuit means includes a resistor electrically connected between said feedback resistor and said amplifier input and a capacitor electrically connected between said input and said output of said amplifier.

12. A voltage controlled resistor circuit comprising:
an operational amplifier having an output terminal and first and second input terminals;
a radiation source electrically connected to said output terminal of said amplifier;
a controlled radiation sensitive resistor which is optically coupled to said radiation source, but which is electrically isolated from said radiation source;
a feedback radiation sensitive resistor which is electrically connected to said first input terminal of said amplifier and which is optically coupled to said radiation source;
controllable voltage means for applying a preselected control voltage to said second input terminal of said operational amplifier to change the radiation output of said radiation source in order to effect a preselected resistance of both said feedback radiation sensitive resistor and said controlled radiation sensitive resistor, wherein said preselected resistances are a function of said preselected control voltage; and
a compensation circuit for stabilizing the preselected resistance of said controlled radiation sensitive resistor to a precise constant value, said compensation circuit including a compensation resistor electrically connected between said feedback radiation sensitive resistor and said first input terminal of said amplifier and further including a capacitor electrically connected between said first input terminal and said output terminal of said amplifier, wherein said compensation resistor and said capacitor have a time constant which compensates for the lag produced by the optical feedback response of said feedback radiation sensitive resistor to said radiation source.

13. A voltage controlled resistor circuit comprising:
an operational amplifier having an output terminal and first and second input terminals;
a radiation source electrically connected to said output terminal of said amplifier;
a controlled radiation sensitive resistor which is optically coupled to said radiation source, but which is electrically isolated from said radiation source;
a feedback radiation sensitive resistor which is electrically connected to said first input terminal of said amplifier and which is optically coupled to said radiation source;
means for applying a reference voltage to said second input terminal of said amplifier;
controllable voltage means for applying a preselected control voltage to said first input terminal of said operational amplifier to change the radiation output of said radiation source in order to effect a preselected resistance of both said feedback and said controlled radiation sensitive resistors, wherein said preselected resistances are a function of said preselected control voltage; and
a compensation circuit for stabilizing the preselected resistance of said controlled radiation sensitive resistor to a precise constant value, said compensation circuit including a compensation resistor electrically connected between said feedback radiation sensitive resistor and said first input terminal of said amplifier and further including a capacitor electrically connected between said first input terminal and said output terminal of said amplifier, wherein said compensation resistor and said capacitor have a time constant which compensates for the lag produced by the optical feedback response of said feedback radiation sensitive resistor to said radiation source.

* * * * *